(12) United States Patent
Usoskin et al.

(10) Patent No.: US 7,829,156 B2
(45) Date of Patent: Nov. 9, 2010

(54) METHOD AND APPARATUS FOR PRODUCING BIAXIALLY ORIENTED THIN FILMS

(75) Inventors: Alexander Usoskin, Göttingen (DE); Lutz Kirchhoff, Hattorf (DE)

(73) Assignee: Bruker HTS GmbH, Hanau (DE)

( * ) Notice: Subject to any disclaimer, the term of this patent is extended or adjusted under 35 U.S.C. 154(b) by 892 days.

(21) Appl. No.: 11/355,427

(22) Filed: Feb. 16, 2006

(65) Prior Publication Data

US 2006/0182891 A1 Aug. 17, 2006

(51) Int. Cl.
*H05H 1/00* (2006.01)

(52) U.S. Cl. .......................... 427/533; 117/84; 250/398; 250/492.3

(58) Field of Classification Search .................. 427/533; 117/84; 250/398, 492.3
See application file for complete search history.

(56) References Cited

U.S. PATENT DOCUMENTS

| 5,432,151 | A | 7/1995 | Russo et al. | 505/474 |
| 7,012,275 | B2* | 3/2006 | Balachandran et al. | 257/33 |
| 2001/0006042 | A1* | 7/2001 | Iijima et al. | 118/718 |
| 2002/0073918 | A1 | 6/2002 | Reade et al. | 117/84 |

\* cited by examiner

*Primary Examiner*—Michael Kornakov
*Assistant Examiner*—Xiao Zhao
(74) *Attorney, Agent, or Firm*—Thomas, Kayden, Horstemeyer & Risley, LLP

(57) ABSTRACT

A method and an apparatus serve to produce thin films having a biaxial crystal orientation. The method includes the steps of: depositing atoms on a substrate, the atoms having a composition corresponding to the thin film to be produced; bombarding the deposited atoms with an energized beam, the energized beam being oriented with respect to the substrate at an angle of a defined range of angles, the step of bombarding substantially taking place during a different time period than the step of depositing; and alternately repeating the step of depositing and the step of bombarding for a plurality of times.

15 Claims, 6 Drawing Sheets

METHOD AND APPARATUS FOR PRODUCING BIAXIALLY ORIENTED THIN FILMS

CROSS REFERENCE TO RELATED APPLICATIONS

This application claims priority to co-pending European Patent Application No. EP 05 003 353.9 entitled "Verfahren zur Herstellung biaxial orientierter Dünnschichten und Vorrichtung zur Durchführung dieses Verfahrens", filed Feb. 17, 2005.

FIELD OF THE INVENTION

The present invention generally relates to a method of producing thin films having a biaxial crystal orientation.

The present invention also generally relates to an apparatus for producing thin films having a biaxial crystal orientation.

For example, such thin films or layers having a biaxial crystal orientation are used as buffer layers in superconducting tapes. However, such thin films may also be used for different cases of application.

BACKGROUND OF THE INVENTION

A method of producing a thin film having a biaxial crystal orientation is known from U.S. Pat. No. 5,432,151. The known method includes the steps of: depositing atoms on a substrate, the atoms having a composition corresponding to the desired thin layer; and, simultaneously to the step of depositing atoms, bombarding the deposited atoms with an energized beam, the beam being oriented with respect to the substrate within a certain angle range. This method is also called IBAD (Ion Beam Assisted Deposition), and it is conducted in an apparatus including a source for atoms and a source for an energized beam. The atoms have a composition corresponding to the desired thin film. The substrate is positioned within a common working range of the two sources such that atoms are deposited on the substrate at the same time as the atoms being deposited on the substrate are bombarded by the energized beam. The energized beam is a beam of accelerated argon ions being oriented with respect to the substrate at an angle between approximately 20° and 70°. The beam partly removes the atoms being deposited on the substrate. Especially, atoms not being located at the desired biaxial crystal orientation on the substrate are removed from the substrate. In this way, during an increase of the thickness of the layer of the respective thin film, the portions having textures which do not correspond to the desired crystal orientation are reduced, whereas the portions having the desired crystal orientation are increased.

In case of the known IBAD method, the substrate needs to be arranged within the working region of both sources for atoms and for an energized beam. Thus, there is not much room in the known apparatus, especially when the sources are located comparatively close to the substrate. The desired biaxial crystal orientation of the thin films being produced by the known method significantly depend on the thickness of the thin film. An X-ray analysis of the texture of a thin film being produced by the known IBAD method results in a full width at half maximum (phi scan) which is in accordance with a negatively sloping exponential function. A full width at half maximum of 25° is only reached when using a minimum thickness of the film of at least 500 nm. Even smaller full widths at half maximum even require substantially greater values of the layers of the thin film. Due to the fact that the increase of thickness of a thin film being produced by the IBAD method is small, the efficiency of the known IBAD method of producing thin films with the desired biaxial crystal orientation is strongly limited.

Another method of producing thin films having a biaxial crystal orientation is known from U.S. Patent Application No. 2002/0073918 A1. In contrast to the known IBAD method, the steps of depositing atoms on the substrate and the steps of bombarding the deposited atoms with an energized beam are conducted at different locations and at different points in time. At first, the atoms for the desired thin film are deposited on the substrate. In the following, the deposited atoms attain the desired biaxial crystal orientation due to the energized beam. For this purpose, a particle beam of accelerated argon ions is directed onto the thin film at an angle of approximately 55° with respect to the substrate. In this way, a texture is imprinted in the surface of the thin film, the texture corresponding to the desired biaxial crystal orientation. However, the range of the argon ions within the thin film only is a few nanometers. Thus, the desired biaxial orientation of the thin film produced by the energized beam only has a small depth. This small depth could only be increased by later anneal of the thin film to cause the crystals to grow. Even then, the known method only realizes a biaxial texture to a small extent. The full width at half maximum during an X-ray analysis (phi scan) is not substantially greater than 25°. This comparatively bad result of the desired biaxial crystal orientation is not compensated by the fact that—due to conducting the steps of depositing and of bombarding the deposited atoms with an energized beam at different points in time—these steps may also be conducted at different locations such that the source for atoms and the source for an energized beam do not interfere although their working ranges overlap in the desired way.

SUMMARY OF THE INVENTION

The present invention relates to a method of producing thin films having a biaxial crystal orientation. The method includes the steps of: depositing atoms on a substrate, the atoms having a composition corresponding to the thin film to be produced; bombarding the deposited atoms with an energized beam, the energized beam being oriented with respect to the substrate at an angle of a defined range of angles, the step of bombarding substantially taking place during a different time period than the step of depositing; and alternately repeating the step of depositing and the step of bombarding for a plurality of times.

The present invention also relates to an apparatus for producing thin films having a biaxial crystal orientation. The apparatus includes a source for atoms, a source for an energized beam and a drive. The atoms have a composition corresponding to the thin film to be produced on a substrate. The source for atoms has a working region. The source for atoms is designed to be positioned with respect to the substrate such that the atoms are deposited on the substrate. The source for an energized beam has a working region, the working region being separate from the working region of the source for atoms. The source for an energized beam is designed to be positioned with respect to the substrate such that the atoms being deposited on the substrate are bombarded by the energized beam. The energized beam is oriented at an angle of a predetermined range of angles. The drive is designed and arranged to move the substrate to alternately pass said source for atoms and said source for an energized beam for a plurality of times.

With the novel method and apparatus, it is possible to produce thin films having an improved biaxial crystal orientation compared to thin films of the same thickness being produced by the IBAD method. Furthermore, the spatial limitations known from the IBAD method due to the overlapping working regions of the source for atoms and the source for an energized laser beam are overcome.

The design of thin films having a biaxial crystal orientation has a special importance in the field of manufacture of superconducting tapes. For example, such a superconducting tapes includes stainless steel and a non-single-crystal substrate. A buffer layer of biaxial crystal orientation is deposited on the substrate. Then, the actual superconductive material also having a biaxial crystal orientation is being deposited on top of the buffer layer. The biaxial crystal orientation of the buffer layer especially imprints the desired biaxial orientation to an epitaxially growing layer of superconducting material. For example, a buffer layer being made of YSZ (zirconium oxide being stabilized with yttrium oxide) may be used for a superconducting layer made of YBCO (yttrium barium copper oxide). However, it is also possible to use other materials for designing buffer layers for the above mentioned superconducting material and other superconducting materials.

Especially, the present invention relates to methods of producing thin films having a biaxial crystal orientation which make use of techniques using the influence of an energized beam on the crystal orientation of a thin film, the film being supported on the substrate. The beam is oriented at a certain angle with respect to the substrate.

In the novel method, the steps of depositing atoms on the substrate and of bombarding the deposited atoms with an energized beam or of subjecting the deposited atoms by an energized beam, respectively, are conducted at different points in time, and they are repeated in an alternating way. This means that the atoms for the desired thin film are not deposited on the substrate in one single step of depositing. Instead, at first, only a comparatively small portion of the atoms is deposited on the substrate. This small portion of the atoms is then bombarded by an energized beam. Afterwards, additional atoms are deposited on the substrate and on the atoms being deposited on the substrate, respectively. Then, the step of bombarding with an energized beam is also repeated. The entire thin film is built up by such steps, each of the steps only producing a small portion of the entire thin film.

Usually, the thickness of the thin film is greater than 100 nm. Preferably, the thickness is some 100 nm. The entire thin film is typically produced by at least ten consecutive steps of depositing atoms on the substrate and respective ten steps of bombarding the deposited atoms with an energized beam. The average thickness by which the thin film increases during one step of depositing and one consecutive step of bombarding of the deposited atoms with an energized beam depends on the actual parameters with which the method is conducted. Typical values are a few nanometers up to approximately 40 nm when producing the respective thin film by dielectric materials having a high melting temperature (more than approximately 1300° C.) and up to 20 nm and more when producing the thin film of electrically conducting materials, as for example metals having a melting temperature of less than approximately 1200° C. Correspondingly, the thin film may be produced in approximately twenty steps of depositing and of consecutive bombarding in case of metals to reach a thickness of approximately 400 nm.

A thin film being produced by the novel method already has a distinctive biaxial orientation when using such a thickness. This distinctive biaxial orientation results in a full width at half maximum of the peaks (fwhm; half intensity width) of approximately 20° or even less when using an X-ray analysis (phi scan). Thus, a small full width at half maximum of the peaks during X-ray analysis is reached at an earlier point in time than it is known from the IBAD method. One reason for this positive effect is the fact that in the novel method the atoms which had not been deposited in the desired biaxial crystal orientation are substantially completely removed from the substrate in the consecutive step of bombarding with an energized beam. As a result, substantially only atoms having the desired biaxial crystal orientation remain located on the substrate. Instead, when using the known IBAD method, there is a substantial statistic probability of atoms remaining located on the substrate, the atoms not having the desired biaxial crystal orientation. Thus, additional atoms epitaxially grow thereon. Such disorientated regions of the thin film according to the prior art cannot be completely removed during further growth of the thin film.

The time-wise separation of the steps of depositing the atoms and of bombarding the deposited atoms with the energized beam according to the novel method does not necessarily mean that there is no time overlap of these two steps at all. It is to be understood that it is sufficient if these steps substantially have no time overlap although it is preferred to have no overlap at all, or to keep the overlap as small as possible.

In the novel method, it is furthermore preferred if non-continuous clusters of atoms are deposited on the substrate and on the previously deposited atoms, respectively, during each step of depositing atoms. Thus, in each step of depositing, it is desired not to deposit continuous regions of atoms, but instead separate single groups. When these non-continuous clusters of atoms are then bombarded by an energized beam, they are completely removed with an especially high probability. In this way, a high concentration of the texture having the desired biaxial crystal orientation is realized in the thin film very quickly.

To realize the novel method in an efficient way, meaning to quickly conduct the steps of depositing atoms and of bombarding the deposited atoms with an energized beam consecutively for a plurality of times, it is possible to move the substrate along a circular path or a spiral path to continuously circulate along the path for a plurality of times to pass through separate portions in which the steps of depositing atoms on the substrate, on the one hand, and of bombarding the deposited atoms with an energized beam, on the other hand, are conducted. Thus, the substrate moving along its circular path repeatedly reaches a portion in which the atoms are deposited on the substrate and a portion in which the deposited atoms are bombarded by an energized beam.

When the substrate is located on a spiral path instead of a circular path, the substrate may be continuously moved while the novel method is conducted in a majority of steps.

When the substrate is guided to move along a circular path or a spiral path, it is especially preferred if the substrate is located in a plane in each portion in which a step of bombarding the deposited atoms with an energized beam is realized. In this way, especially favorable conditions for attaining the desired biaxial crystal orientation by the energized beam are realized. In case the substrate is oriented in a sloped way in this portion, there are substantially less constant and thus less advantageous angle conditions. For each region in which a step of depositing atoms on the substrate is realized, it is also advantageous if the substrate is oriented in a plane.

Although it is usually the case, it is not necessary in the novel method to always deposit the same kind of atoms of the same composition on the substrate and on the previously deposited atoms, respectively, during the consecutive steps of depositing atoms. It is also possible to vary the kind and composition of the deposited atoms over the thickness of the produced thin film.

Furthermore, the energized beam does not have to have an identical design and orientation during each step of bombarding the deposited atoms. Instead, it is possible to vary the beam with respect to its kind, its composition, its energy, its power and/or its angle of orientation with respect to the substrate in between the steps. However, usually, the beam is not varied in between the consecutive steps of bombarding the deposited atoms.

The beam may be one of a kind including accelerated noble gas ions. Argon ions are especially suitable. The charge of the accelerated noble gas ions can be neutralized by additional electrons, as this is generally known in the art. However, the energized beam may also be a beam of lighter particles, as for example electrons, or an electromagnetic beam of sufficient energy. The angle at which the energized beam is oriented with respect to the substrate according to the invention usually is not totally kept constant, but it instead is chosen within an angle range of some degrees. For example, the angle range is approximately 55°. The possible extreme values of the angle are approximately 20° and 70°.

The novel apparatus for producing thin films is capable of conducting the novel method.

Preferably, the drive of the substrate is continuously moved along a circular path or a spiral path.

It is especially preferred if the drive guides an elongated tape or band as the substrate along a spiral path which extends over the circumference for a plurality of times such that the source for atoms and the source for an energized beam affect the substrate while moving in a rotating way along the spiral path. In this way, a complete thin layer of biaxial crystal orientation can be deposited on the elongated tape during one complete movement through the apparatus. The source for atoms and the source for an energized beam may be located in different regions of the circular path or of the spiral path to face the circular path or the spiral path from a radial outer direction.

The novel apparatus is not necessarily designed in a way that the portions in which the different sources for atoms and for an energized beam affect the substrate do not overlap. An unessential spatial overlap of these portions usually only has an unessential influence on the desired functionality of the novel apparatus.

To increase the total volume of the biaxially oriented thin film which can be produced by the novel apparatus during a certain period of time, it is possible to arrange a plurality of sources for atoms and a plurality of sources for energized beams as pairs one after the other in the direction of the path on which the substrate is moved by the drive. The plurality of sources for atoms may be identical, or sources may be different. However, usually they are identical. Certain cases are imaginable in which different sources produce thin films of special quality. The same applies to the plurality of sources for an energized beam.

Other features and advantages of the present invention will become apparent to one with skill in the art upon examination of the following drawings and the detailed description. It is intended that all such additional features and advantages be included herein within the scope of the present invention, as defined by the claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention. In the drawings, like reference numerals designate corresponding parts throughout the several views.

DETAILED DESCRIPTION

Figure 1:
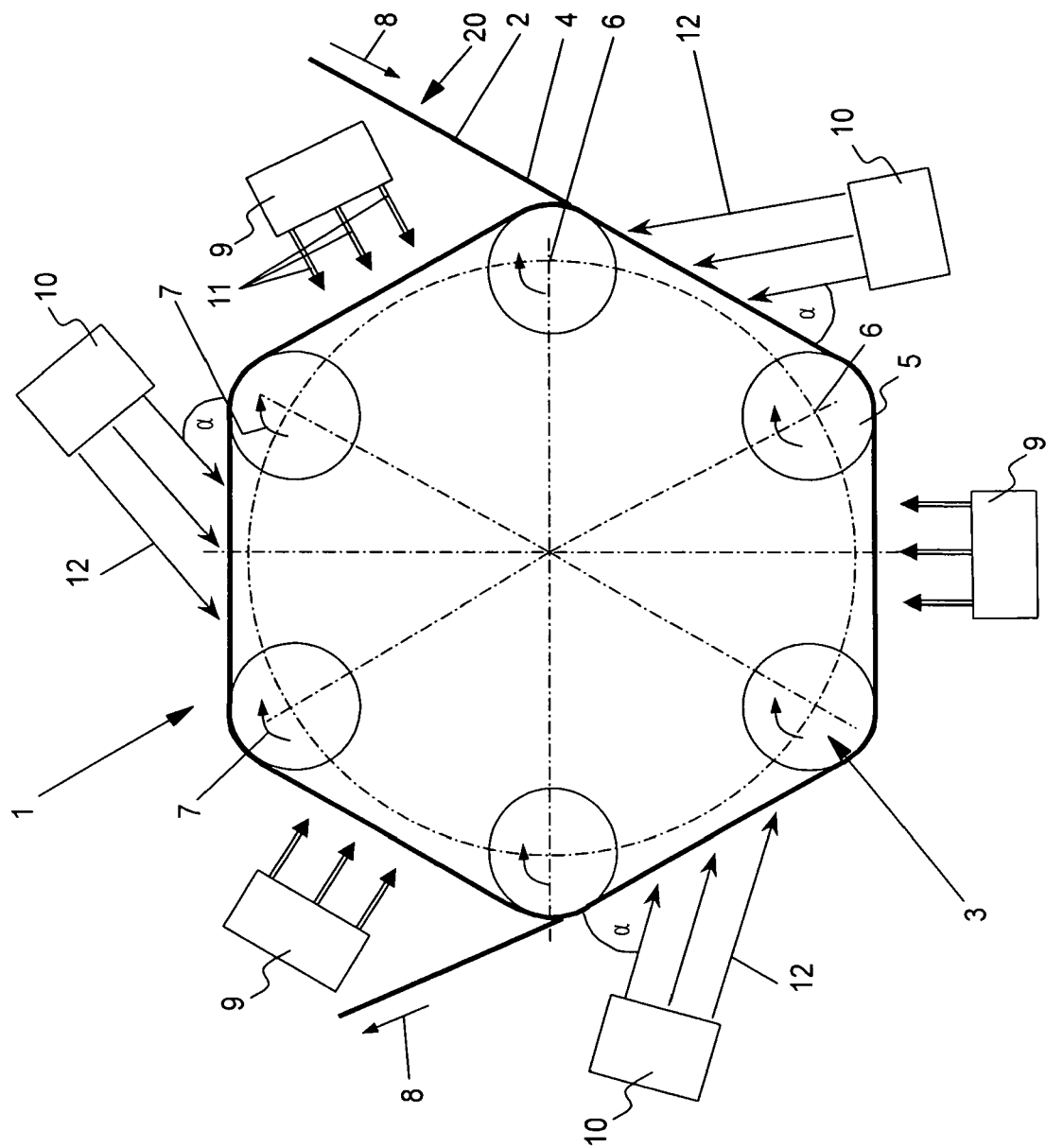
FIG. 1 is a top view of a first exemplary embodiment of the novel apparatus for producing thin films.
Figure 2:
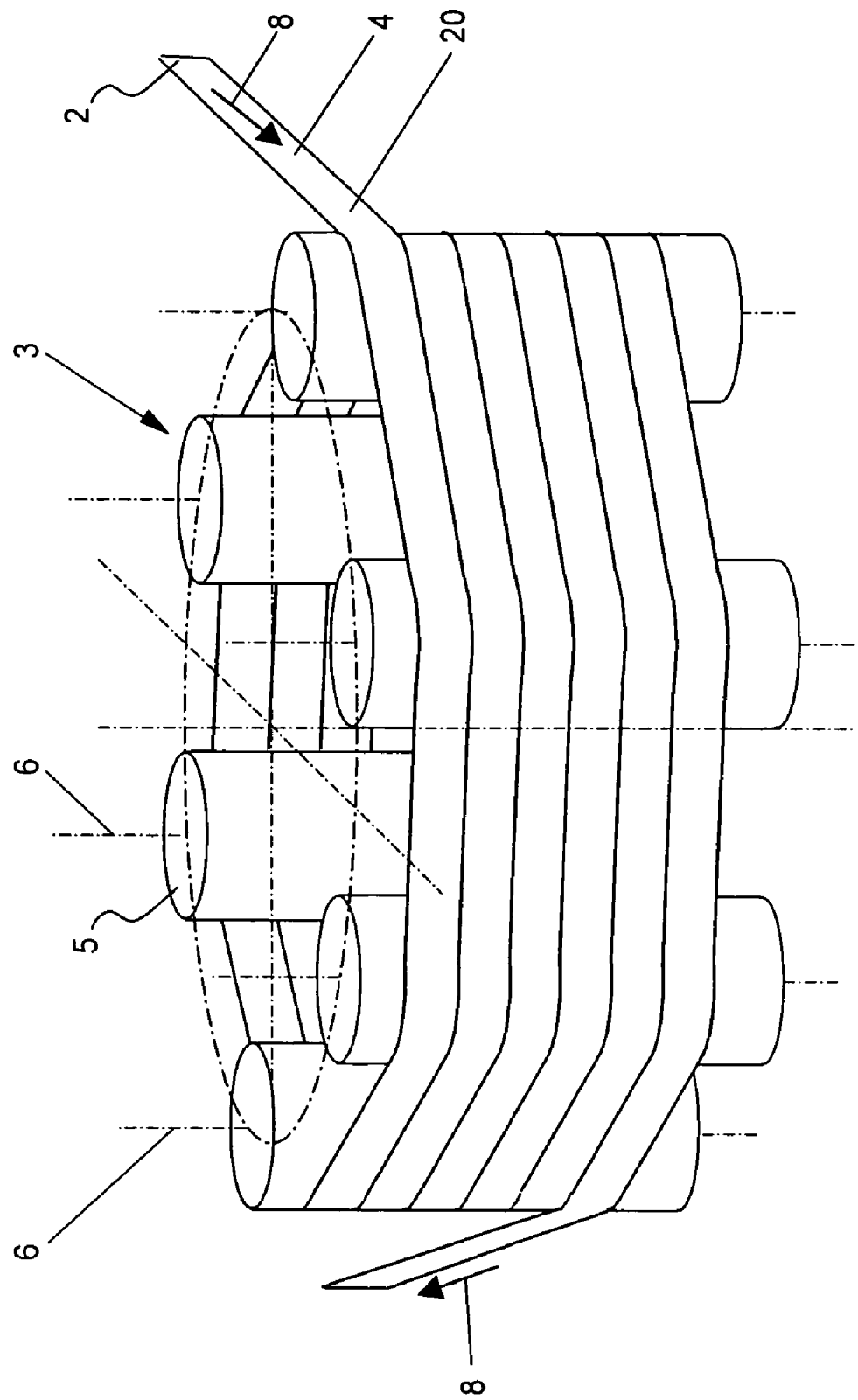
FIG. 2 is a perspective side view of a drive of the novel apparatus for producing thin films according to FIG. 1, the drive serving to move a tape-shaped substrate.

Referring now in greater detail to the drawings, FIG. 1 is a view of a novel apparatus 1 for producing a thin film on a substrate 2. The apparatus 1 includes a drive 3 for the substrate 2. In this case, the substrate 2 has the shape of an elongated tape 4. The drive 3 for the substrate 2 (being designed as the tape 4) is separately illustrated in FIG. 2. The drive 3 includes six rollers 5 which are supported to rotate about the rotational axes 6. The rotational axes 6 are arranged to be substantially parallel. The rollers 5 are driven to rotate about their rotational axes 6 in the same sense of rotation. This movement is indicated in FIG. 1 by arrows 7.

The tape 4 is wound up on a spiral path about the rollers 5. This arrangement is to be best seen in FIG. 2. Due to the rotational movement of the rollers 5, the tape 4 is pulled to move forward on the rollers 5 in the direction of arrows 8, it is guided along the spiral path, and it then gets free from contact to the rollers 5. The tape 4 is suspended in a way that it is located in a plane between two adjacent rollers 5, the tape 4 being located in the same plane between the same rollers 5 after a rotation about 360°.

Sources 9 for atoms and sources 10 for an energized beam are alternately arranged to face these plain portions of the tape 4.

The sources 9 deliver atoms (schematically illustrated by arrows 11) of a composition corresponding to the composition of the thin film to be deposited on the substrate 2. In the illustrated exemplary embodiment, the sources 9 are illustrated such that they send out atoms in a direction approximately perpendicular with respect to the plane of the substrate 2. Although this is the case in the illustrated embodiment, this arrangement is not necessarily required.

The sources 10 send out an energized beam 12 at a defined angle $\alpha$ with respect to the plane in which the substrate 2 is located. The energized beam 12 serves to remove the atoms which do not have the desired biaxial crystal orientation with respect to the plane of main extension and to the surface normal of the tape 4 from the tape 4.

The atoms had been previously deposited on the tape 4 by the source 9 being located upstream of the source 10 as seen in the moving direction of the tape 4. During its multiple circulations about the rollers 5, each source 9 deposits such an amount of atoms on the tape 4 which corresponds to separate, non-continuous clusters of atoms on the tape 4. The clusters not having the desired biaxial crystal orientation are removed by the source 10 being located downstream of the source 9 as seen in the moving direction of the tape 4. The remaining clusters are not removed or at least not completely removed. In this way, the repeating passage of the tape 4 with respect to the sources 9 and 10 results in growth of a thin film of a defined composition and having a biaxial crystal orientation on the tape 4. The entire apparatus 1 according to FIG. 1 usually is located in a vacuum apparatus to conduct coating of the tape 4 with a thin film under a defined atmosphere of low absolute pressure.

Figure 3:
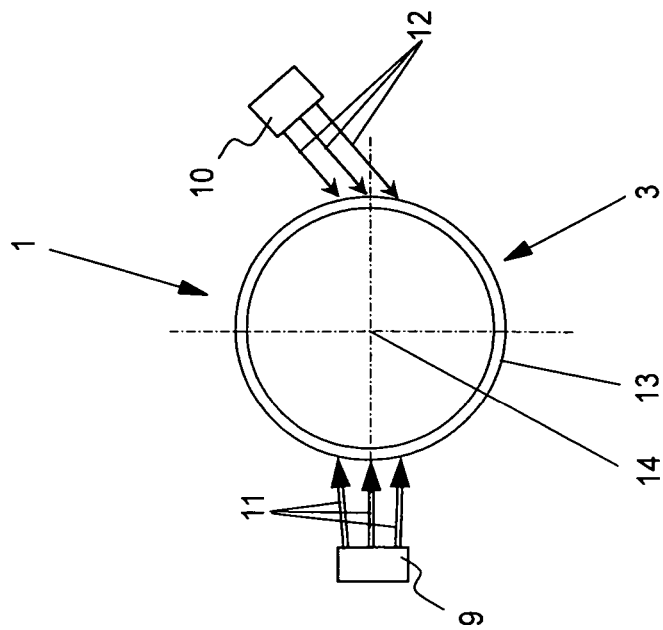
FIG. 3 is a top view of a second exemplary embodiment of the novel apparatus for producing thin films.
Figure 4:
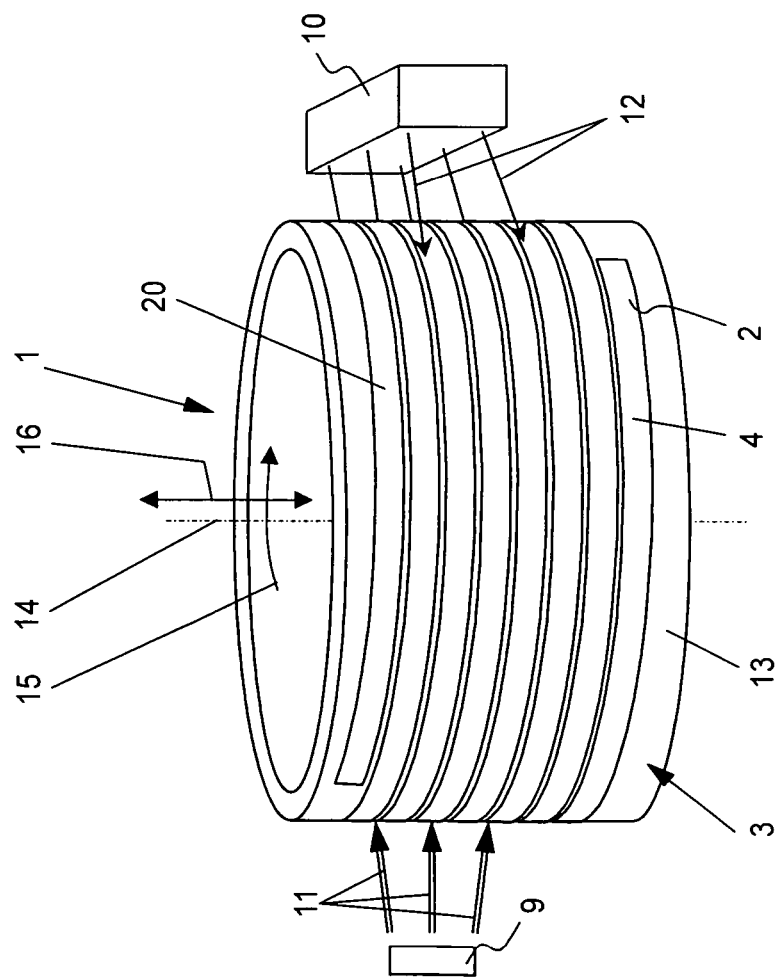
FIG. 4 is a perspective side view of the novel apparatus for producing thin films according to FIG. 3.

The apparatus 1 illustrated in FIGS. 3 and 4 includes a drum 13 serving as the drive 3 for the substrate 2. Once again, the substrate 2 is designed as a tape 4. The drum 13 is supported to be driven to rotate about a rotational axis 14 in the direction of arrow 15. Furthermore, the drum 13 is designed to be movable in the direction of the rotational axis 14 which is indicated by double arrow 16. A source 9 for atoms and a source 10 for an energized beam 12 are located in two opposite portions with respect to the rotational axis 14. The sources 9 and 10 are arranged with respect to the circumference of the drum 13 on which the tape 4 is wound up along a spiral path. Rotation of the drum 13 about the rotational axis 14 and displacement of the drum 13 along the rotational axis 14 results in all portions of the tape 4 reaching the region being influenced by the sources 9 and 10 in an alternating way for approximately the same period of time. In this way, a thin film of approximately uniform thickness having a biaxial crystal orientation builds up on the tape 4 along its entire length. The conditions for attaining a biaxial orientation of the thin film growing upon the tape 4 as good as possible with this embodiment of the apparatus 1 is not quite as favorable as in case of the apparatus 1 according to FIG. 1. This is the case since the angle α at which the energized beam 12 coming from the source 10 contacts the substrate 2 only has the predetermined value in the center region of the beam 12 whereas it differs from this value in the portions in front of and after as seen in the circumferential direction of the drum 13. FIG. 3 makes it clear that the novel apparatus 1 with which a novel method for producing thin films 17 can be conducted substantially differs from the known IBAD method. The conditions with respect to the arrangement of the sources 9 and 10 generally are improved. In the known IBAD apparatus, the regions being influenced by the sources necessarily have to overlap. This means that the sources of the known apparatus have to be located adjacent to one another within a small angle portion above the substrate. This limitation does not apply to the novel apparatus 1. Furthermore, it is not necessary in the novel apparatus 1 to choose the portions of the substrate 2 which are influenced by the sources 9 and 10 to have the same size. It is sufficient to ensure in some way that a certain portion of the tape 4 alternately passes below the sources 9 and 10 in a way that it is located in the portions being influenced by the sources 9 and 10 for coordinated periods of time such that the source 10 with the energized beam 12 is capable of removing the atoms being previously deposited on the tape 4 which do not have the desired biaxial crystal orientation. It is preferred that the beam 12 is oriented with respect to the tape 4 in a perpendicular way. Usually, the apparatus 1 according to FIGS. 3 and 4 is located within a vacuum apparatus (not illustrated).

The exemplary embodiment of the novel apparatus 1 illustrated in FIG. 5 once again uses a substrate 2 being designed as a tape 4. The substrate 2 is wound up on two rollers 5 having parallel rotational axes 6. The rollers 5 serve as the drive 3 for the substrate 2. The tape 4 is moved to pass below two pairs of two sources 9 and 10. The influence regions A and B of the sources 9 and 10 are arranged on the surface 20 of the substrate 2 one after the other.

Figure 5:
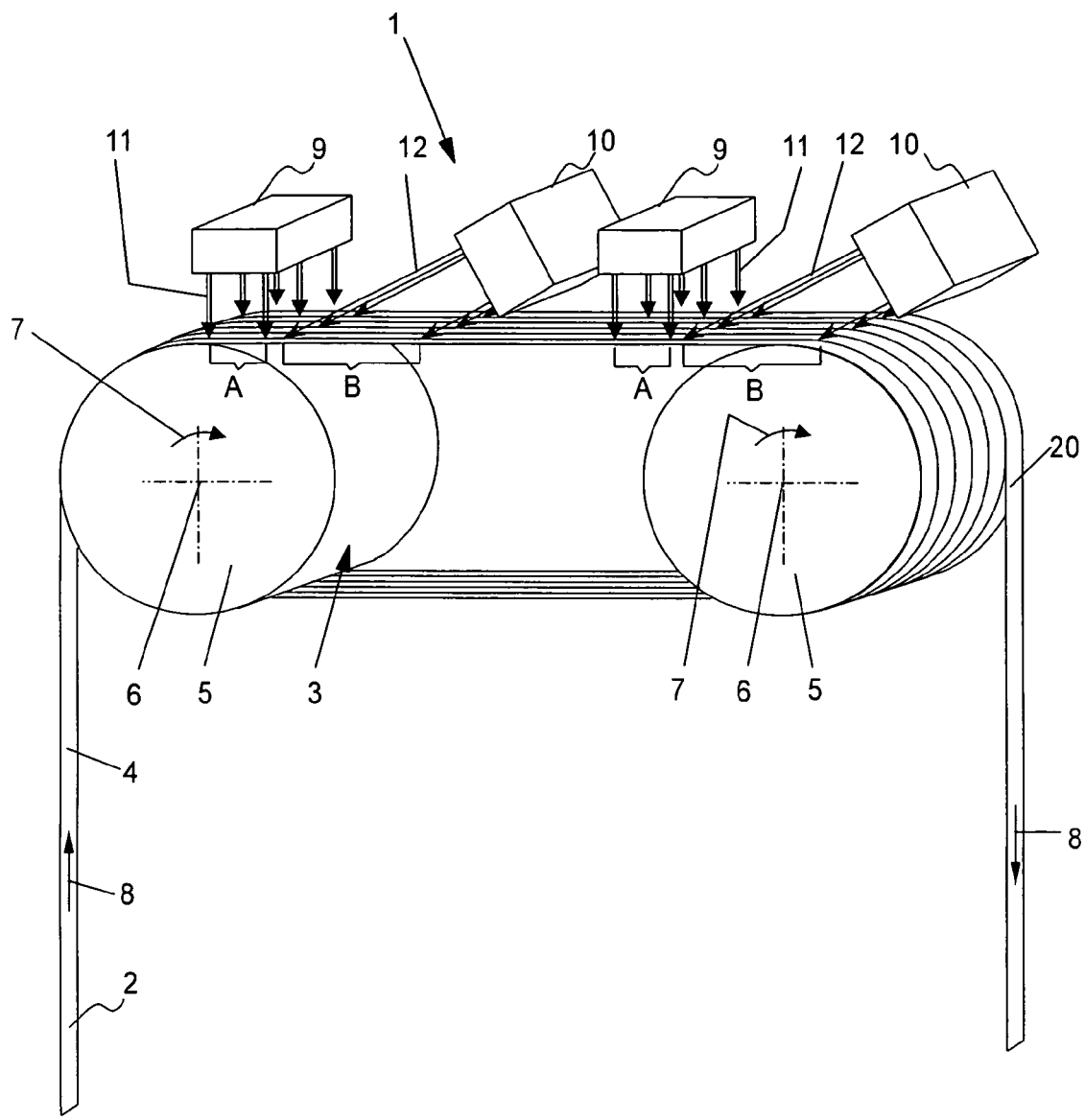
FIG. 5 is a perspective side view of a third exemplary embodiment of the novel apparatus for producing thin films.
Figure 6:
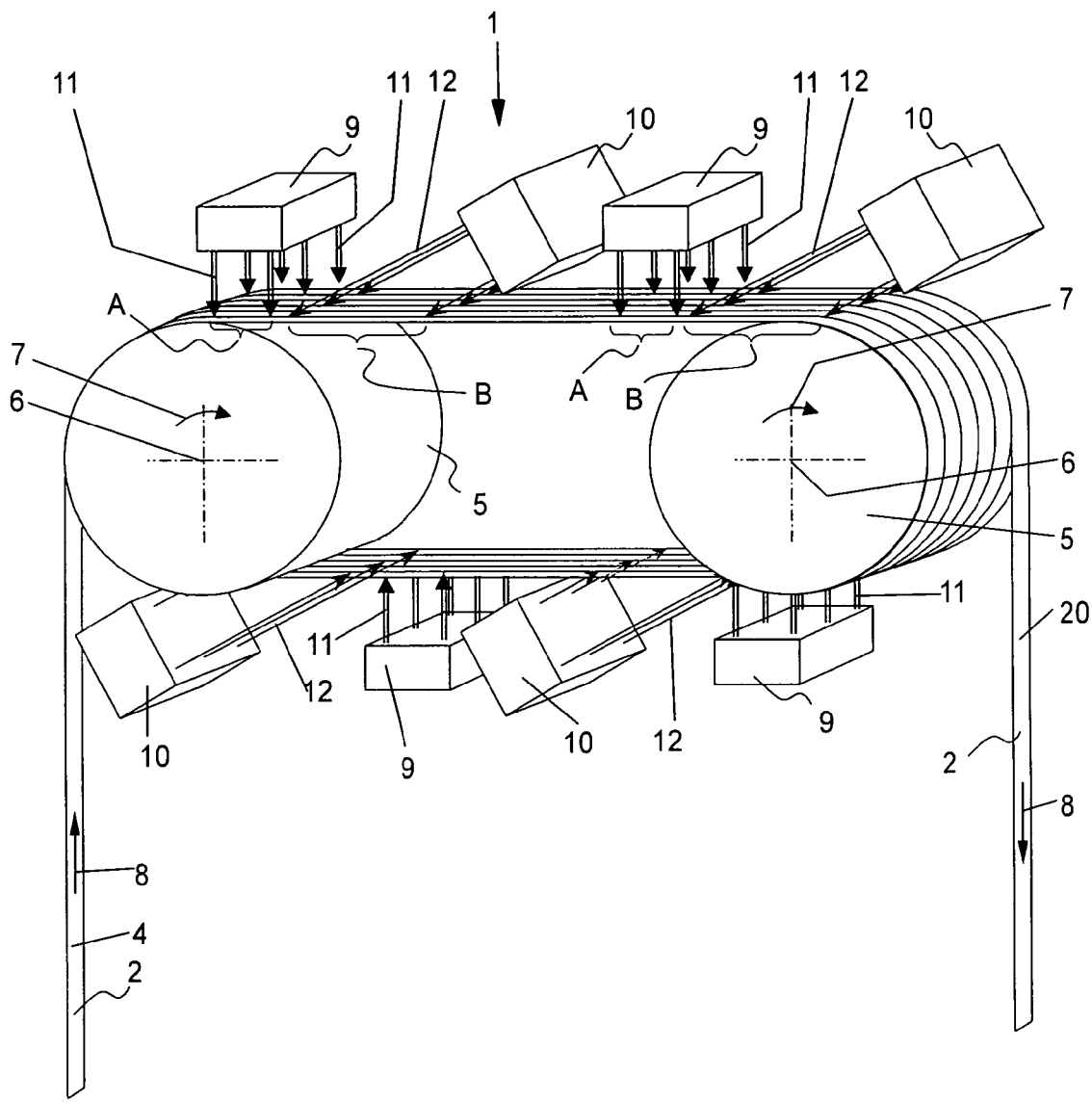
FIG. 6 is a perspective side view of a fourth exemplary embodiment of the novel apparatus for producing thin films, the apparatus including a plurality of sources for atoms and of sources for an energized beam.

As well as FIG. 5, FIG. 6 also illustrates two additional pairs of sources 9 and 10 being arranged at the opposite side of the rollers 5 with respect to the tape 4. In this way, the thickness of the thin film 17 being produced per time unit is doubled when the same velocity of movement of the tapes 4 in the direction of arrows 8 and the same operational conditions of all sources 9 and 10 are used.

Figure 7:
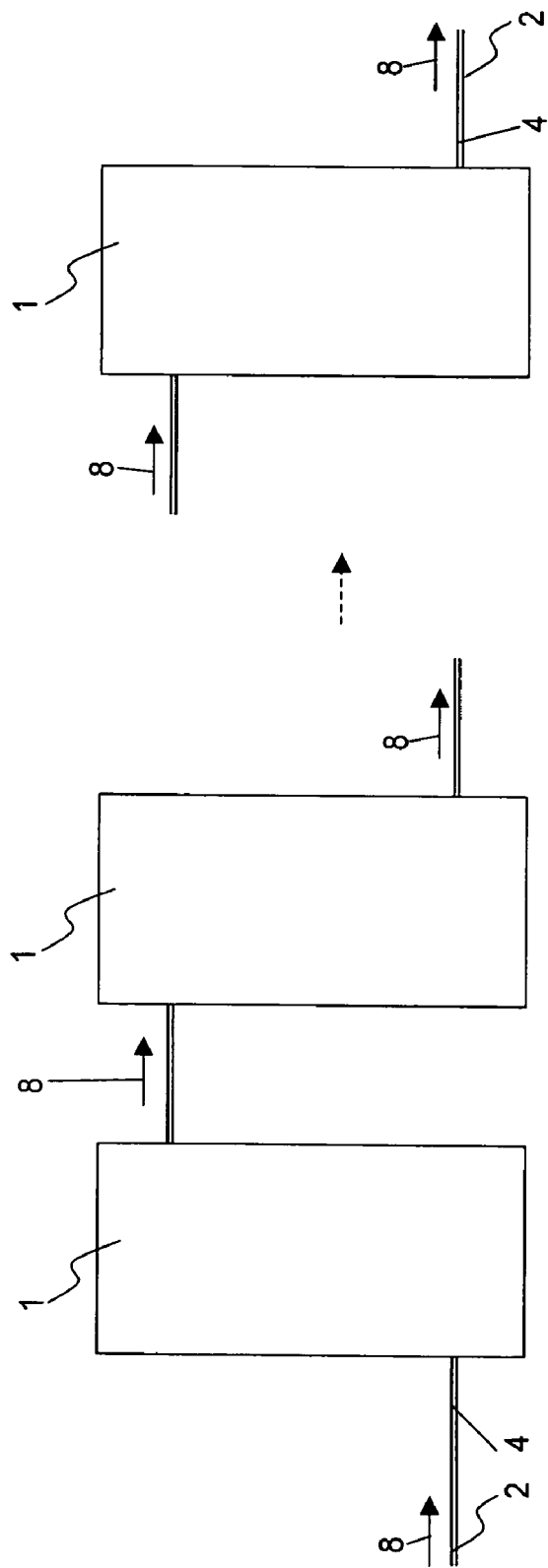
FIG. 7 is a block diagram illustrating the arrangement of a plurality of apparatuses according to FIG. 5 or FIG. 6.

To attain even greater increase of the thickness of the layer of the thin film 17 being deposited on the tape 4 without increasing the thickness of the layer being produced in each single step including a combination of a source 9 and a source 10, it is possible to arrange a plurality of apparatuses 1 according to FIG. 5 or FIG. 6 one after the other, as this is schematically illustrated in FIG. 7. It is preferred to arrange all apparatuses 1 in a vacuum apparatus, or to arrange pressure locks between the separate apparatuses 1 such that each of the apparatuses 1 is capable of operating under a defined atmosphere at reduced absolute pressure.

Figure 8:
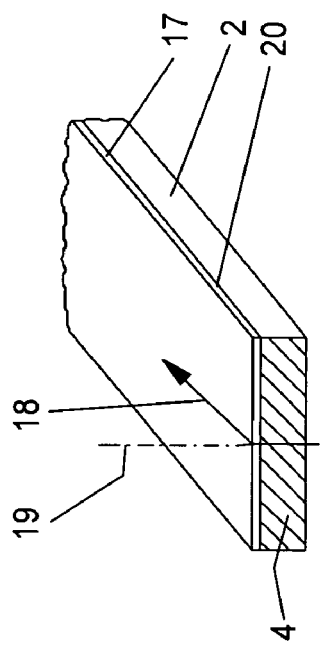
FIG. 8 is a cross-sectional view of a tape-shaped substrate including a thin film being produced by one of the novel apparatuses according to FIGS. 1 to 6.

FIG. 8 is a strongly enlarged not to scale view illustrating a cross-section through the substrate 2 being designed as a tape 4 after having applied a thin film 17 with an apparatus 1 according to one of FIGS. 1 to 6. The thin film 17 has a defined biaxial crystal orientation with respect to the longitudinal direction 18 of the tape 4 and to the surface normal 19 of the surface 20 of the substrate 2 being coated with the thin film 17. The biaxial orientation during X-ray analysis of the texture of the thin film 17 (phi scan) results in peaks of limited full width at half maximum (fwhm; half intensity width) of typically $\leqq 20°$.

In the following, the present invention is further explained and described with respect to some examples of the novel method for producing a thin film and respective examples of the known IBAD technique for reasons of comparison.

EXAMPLE 1

According to the present invention, a textured thin film 17 of zirconium oxide being stabilized with yttrium oxide (YSC) was deposited on a tape 4 made of stainless CrNi steel. The tape 4 of stainless steel had a length of 10 m, a width of 4 mm and a thickness of 0.1 mm. The surface 20 of the substrate 2 had been polished electrochemically to limit the surface roughness to 4 nm. The tape 4 was wound up about the drum 13 of the apparatus 1 according to FIGS. 3 and 4. The apparatus 1 was then arranged in a vacuum chamber (not illustrated in FIGS. 3 and 4). An ion sputter source was used in the vacuum chamber as the source 9 for atoms, and an ion beam source was used as the source 10 for an energized beam. The diameter of the drum 13 was 1 m. The ion beam source provided an ion beam of argon ions at an angle of incidence of between 51° to 58° with respect to the tape 4. The ion beam source was an ion gun of the "Kaufmann" type with a diameter of 11 cm which delivered particles with an energy of 300 eV±20 eV. The source 10 additionally assured neutralization of the ion charge by simultaneously delivering an electron flow. The total ion flow corresponded approximately to 100 mA. The influence region of the energized beam 12 at the circumference of the drum 13 was approximately 120 mm×80 mm. The source 9 for atoms deposited atoms in a region of 80 mm×80 mm at the circumference of the drum 13. The drum 13 rotated at a frequency of 1 min$^{-1}$ about its rotational axis 14 during deposit of the thin film 17. The evacuated vacuum chamber contained oxygen with a partial pressure of $2\times10^{-4}$ mbar to adjust the active deposit windings.

Due to rotation of the drum 13, one attained a sequence of the steps of depositing and of bombarding with an energized beam. During deposit of the thin film 17 on the tape 4, the temperature of the tape 4 increased, but not in a way to exceed 100° C. During a time of experimentation of 4.0 hours, a textures thin film 17 of 460 nm was deposited. The biaxial crystal orientation of the thin film 17 resulted in a full width at half maximum during X-ray analysis of the texture (phi scan) of 18°. The thickness of the thin film 17 of 460 nm corresponds to an increase of the thickness during each step of depositing atoms and the corresponding step of bombarding the deposited atoms with an energized beam of approximately 2 nm when rotation the drum 13 during the time of experimentation for a total of 240 rotations.

EXAMPLE 2

Prior Art; For Reasons of Comparison Only

For reasons of comparison, a textured layer of zirconium oxide being stabilized with Yttrium oxide (YSC) was produced according to the prior art as disclosed in U.S. Pat. No. 5,432,151, meaning the IBAD method. The conditions of this example were the same ones as in example 1 with the exception of the influence regions of the two sources 9 and 10 on the tape 4 being superimposed. This means that the source 10 in FIG. 3 was rotated about the rotational axis 14 by 180° with respect to the source 9. Furthermore, the influence region of the energized beam 12 on the tape 4 was adapted with respect to its size to the influence region of the source 9 on the tape 4 such that both regions were 80 mm×80 mm. After a time of experimentation of 3.9 hours, one attained a textured thin film 17 having a thickness of 500 nm the biaxial crystal orientation of which was described during an X-ray analysis by a full width at half maximum (phi scan) of 25°. This means that the texture was much less distinctive than in the corresponding example 1 relating to the present invention although the thin film 17 which was produced in example 2 even has a slightly thicker thin layer 17 than the one of example 1 which had been produced after an even slightly longer time of experimentation. The production rates attained by the two examples were approximately identical due to the approximately identical times of experimentation such that the substantially more biaxial crystal orientation attained in the example 1 provided the decisive difference.

EXAMPLE 3

Example 3 which was conducted according to the present invention generally was conducted under the same conditions as example 1 with the exception of the time of experimentation being increased to 7.4 hours. The attained textured thin film 17 had a thickness of 850 nm, and its biaxial crystal orientation showed a full width at half maximum (phi scan) during X-ray analysis of 14°.

EXAMPLE 4

Prior Art; For Reasons of Comparison Only

Example 4 was also conducted according to the IBAD method under the conditions of example 2, but instead with a time of experimentation of 7.2 hours and dimensions of 120 mm×120 mm of the influence region of the source 9 for atoms on the tape 4 as well as of the influence region of the source 10 for an energized beam 12 on the tape 4. The deposited thin film 17 had a thickness of 800 nm, and it showed a full width at half maximum during X-ray analysis (phi scan) of 18°, meaning a substantially less significant biaxial crystal orientation than the thin film 17 of example 3. The production rates in relation to the length of the tape 4 as well as to the volume of the thin film 17 were approximately identical in the two examples 3 and 4. With respect to the volume of the thin film 17, the production rate of the example 3 even was slightly greater.

EXAMPLE 5

Example 5 was in accordance with the present invention, and it had been conducted under the same conditions as example 1, with the exception of the time of experimentation being increased to 11.3 hours. The attained textured thin film 17 was 1250 nm thick, and it had a full width at half maximum during X-ray analysis of the peaks (phi scan) of 12.2°. Once again, this is an excellent value of biaxial crystal orientation when taking into account the thickness of the textured film and the production velocity.

In the following table, the results of the examples 1, 3 and 5 according to the invention as well as the examples 2 and 4 according to the prior art are illustrated. The table once again makes it clear that the method according to the invention is capable of producing thin films of better quality with respect to the biaxial crystal orientation. The table also makes it clear with respect to the results of examples 1 and 4 that the present invention makes it possible to increase production velocity when reaching a biaxial crystal orientation having a full width at half maximum of 18° by a factor of 1.8 (quotient of the time of experimentation of examples 4 and 1 of 7.2 hours and 4.0 hours).

TABLE

| example | characterization | thickness of the thin film [nm] | texture full width at half maximum (phi scan) | time of experimentation [h] |
|---|---|---|---|---|
| 1 | according to the invention | 460 | 18° | 4.0 |
| 2 | IBAD | 500 | 25° | 3.9 |
| 3 | according to the invention | 850 | 14° | 7.4 |
| 4 | IBAD | 800 | 18° | 7.2 |
| 5 | according to the invention | 1250 | 12.2° | 11.3 |

Many variations and modifications may be made to the preferred embodiments of the invention without departing substantially from the spirit and principles of the invention. All such modifications and variations are intended to be included herein within the scope of the present invention, as defined by the following claims.

We claim:

1. A method of producing a thin film having a biaxial crystal orientation, said method comprising the steps of:
   depositing a plurality of atoms on a substrate, the plurality of atoms having a composition corresponding to a composition of the thin film to be produced;
   bombarding the deposited atoms with an energized beam, the energized beam being oriented with respect to the substrate at an angle of a defined range of angles, said step of bombarding substantially taking place during a different time period than said step of depositing; and alternately repeating said step of depositing and said step of bombarding for a plurality of times to produce a single textured film of zirconium oxide stabilized with yttrium oxide, wherein the texture of the thin film measured as the full width at half maximum in a phi scan of about 18° is achieved at a thickness of the thin film of about 460 mm.

2. The method of claim 1, wherein in each step of depositing a plurality of atoms, the plurality of atoms are deposited on the substrate and on the previously deposited atoms.

3. The method of claim 1, wherein in each step of bombarding previously deposited atoms are removed, the removed atoms not having the desired biaxial crystal orientation.

4. The method of claim 2, wherein in each step of bombarding previously deposited atoms are removed, the removed atoms not having the desired biaxial crystal orientation.

5. The method of claim 1, wherein the substrate is continuously moved along a circular path to repeatedly pass through a first region in which said steps of depositing take place and a separate second region in which said steps of bombarding take place.

6. The method of claim 2, wherein the substrate is continuously moved along a circular path to repeatedly pass through a first region in which said steps of depositing take place and a separate second region in which said steps of bombarding take place.

7. The method of claim 3, wherein the substrate is continuously moved along a circular path to repeatedly pass through a first region in which said steps of depositing take place and a separate second region in which said steps of bombarding take place.

8. The method of claim 4, wherein the substrate is continuously moved along a circular path to repeatedly pass through a first region in which said steps of depositing take place and a separate second region in which said steps of bombarding take place.

9. The method of claim 1, wherein the substrate is continuously moved along a spiral path to repeatedly pass through a first region in which said steps of depositing take place and a separate second region in which said steps of bombarding take place.

10. The method of claim 2, wherein the substrate is continuously moved along a spiral path to repeatedly pass through a first region in which said steps of depositing take place and a separate second region in which said steps of bombarding take place.

11. The method of claim 3, wherein the substrate is continuously moved along a spiral path to repeatedly pass through a first region in which said steps of depositing take place and a separate second region in which said steps of bombarding take place.

12. The method of claim 4, wherein the substrate is continuously moved along a spiral path to repeatedly pass through a first region in which said steps of depositing take place and a separate second region in which said steps of bombarding take place.

13. The method of claim 8, wherein the substrate is oriented to be plain in the second region.

14. The method of claim 12, wherein the substrate is oriented to be plain in the second region.

15. A method of producing a thin film having a biaxial crystal orientation, said method comprising the steps of:
depositing a plurality of atoms on a substrate to form separate, non-continuous clusters of atoms;
bombarding the deposited atoms with a beam of accelerated particles to remove clusters of previously deposited atoms not having the desired biaxial crystal orientation, the beam being oriented with respect to the substrate within a defined range of angles, said step of bombarding substantially taking place during a different time period than said step of depositing; and
alternately repeating said step of depositing and said step of bombarding for a plurality of times to produce a single textured thin film of zirconium oxide stabilized with yttrium oxide and having a biaxial crystal orientation, wherein the texture of the thin film measured as the full width at half maximum in a phi scan of about 18° is achieved at a thickness of the thin film of about 460 mm.

* * * * *